(12) United States Patent
Sang et al.

(10) Patent No.: US 8,988,922 B1
(45) Date of Patent: Mar. 24, 2015

(54) RADIATION-HARDENED STORAGE UNIT

(71) Applicant: Huazhong University of Science and Technology, Wuhan (CN)

(72) Inventors: Hongshi Sang, Wuhan (CN); Wen Wang, Wuhan (CN); Tianxu Zhang, Wuhan (CN); Chaobing Liang, Wuhan (CN); Jing Zhang, Wuhan (CN); Yang Xie, Wuhan (CN); Yajing Yuan, Wuhan (CN)

(73) Assignee: Huazhong University of Science and Technology, Wuhan (CN)

( * ) Notice: Subject to any disclaimer, the term of this patent is extended or adjusted under 35 U.S.C. 154(b) by 0 days.

(21) Appl. No.: 14/142,987

(22) Filed: Dec. 30, 2013

(30) Foreign Application Priority Data

Sep. 4, 2013 (CN) .......................... 2013 1 0397216

(51) Int. Cl.
*G11C 5/06* (2006.01)
*G11C 5/00* (2006.01)

(52) U.S. Cl.
CPC . *G11C 5/005* (2013.01); *G11C 5/06* (2013.01)
USPC .......................................................... 365/72

(58) Field of Classification Search
USPC .................................................... 365/63–72
See application file for complete search history.

(56) References Cited

U.S. PATENT DOCUMENTS

| 4,887,236 A * | 12/1989 | Schloemann ................. 365/173 |
| 5,315,544 A * | 5/1994 | Yokote et al. ................ 365/154 |
| 6,744,661 B1 * | 6/2004 | Shubat ......................... 365/156 |
| 6,917,533 B2 * | 7/2005 | Gardner et al. ................. 365/94 |
| 6,990,010 B1 * | 1/2006 | Plants ....................... 365/189.15 |
| 2005/0219891 A1 * | 10/2005 | Gardner et al. .............. 365/104 |
| 2007/0242537 A1 * | 10/2007 | Golke et al. .................. 365/194 |
| 2008/0094896 A1 * | 4/2008 | Erickson et al. ......... 365/185.09 |

\* cited by examiner

*Primary Examiner* — Harry W Byrne
(74) *Attorney, Agent, or Firm* — Matthais Scholl P.C.; Matthias Scholl

(57) ABSTRACT

A radiation-hardened storage unit, including a basic storage unit, a redundant storage unit, and a two-way feedback unit. The basic storage unit includes a first PMOS transistor, a second PMOS transistor, a third PMOS transistor, and a fourth PMOS transistor. The first PMOS transistor and the second PMOS transistor are read-out access transistors. The third PMOS transistor and the fourth PMOS transistor are write-in access transistors. The redundant storage unit includes a fifth PMOS transistor, a sixth PMOS transistor, a seventh PMOS transistor, and an eighth PMOS transistor. The fifth PMOS transistor and the sixth PMOS transistor are read-out access transistors. The seventh PMOS transistor and the eighth PMOS transistor are write-in access transistors. The two-way feedback unit is configured to form a feedback path between the storage node and the redundant storage node.

2 Claims, 5 Drawing Sheets

RADIATION-HARDENED STORAGE UNIT

CROSS-REFERENCE TO RELATED APPLICATIONS

Pursuant to 35 U.S.C. §119 and the Paris Convention Treaty, this application claims the benefit of Chinese Patent Application No. 201310397216.1 filed Sep. 4, 2013, the contents of which are incorporated herein by reference. Inquiries from the public to applicants or assignees concerning this document or the related applications should be directed to: Matthias Scholl P.C., Attn.: Dr. Matthias Scholl Esq., 14781 Memorial Drive, Suite 1319, Houston, Tex. 77079.

BACKGROUND OF THE INVENTION

1. Field of the Invention

The invention relates to a storage unit, and more particularly to a radiation-hardened storage unit.

2. Description of the Related Art

In aerospace electronic systems, the memory is a very important part occupying most of the chip area. In the space environment, an electronic system may be adversely affected by radiations from the galaxy, the sun, the earth and other radiators. Therefore, the memory is one of the most vulnerable parts in an aerospace electronic system for its high density.

Total ionizing dose radiation, single event latchup, and single event upset are three effects that most significantly affect the memory. In the 0.18 um process and advanced processes, as a thickness of the gate oxide is less than 5 nm, main effect of the total ionizing dose radiation is leakage current generated in a NMOS transistor. The single event latchup is that instantaneous current pulses generated by single event radiation are cyclically amplified by a feedback loop parasitized in an integrated circuit and thus burning a chip therein. The single event upset is that instantaneous current pulses generated by single event radiation at sensitive nodes lead to data error in a storage unit.

As shown in FIGS. 1 and 2, in order to harden total ionizing dose radiation of a storage unit, a profiled gate is used for hardening a NMOS transistor. In FIG. 1, an annular FET layout technique is used for hardening the NMOS transistor: one of a drain 102 and a source 103 is completely surrounded by a gate 101 whereby physically isolating a path generated by leakage current and hardening total ionizing dose radiation. In FIG. 2, a horseshoe FET layout technique is used for hardening the NMOS transistor: one of a drain 202 and a source 203 is half surrounded by a gate 201 whereby increasing a path length of leakage current, reducing leakage caused by total ionizing dose radiation, and hardening total ionizing dose radiation.

Currently, to harden single event latchup of a storage unit, an isolating ring is added between a NMOS transistor layout and a PMOS transistor layout, so that a loop gain of a parasitized feedback ring is far less than 1, and instant current of single event radiation is not to be amplified.

Conventional methods for hardening single event upset include: a triple modular redundancy (TMR), a dual interlocked storage cell (DICE) in FIG. 3, and a heavy ion tolerant (HIT) unit in FIG. 4. In FIG. 3, each of four storage nodes X1, X2, X3 and X4 in a DICE unit 300 is controlled by an inverter via two adjacent nodes, and thus hardening single event upset via dual-node feedback. In FIG. 4, a HIT unit 400 makes use of different drive capability of transistors 407, 408, 411 and 412 (namely drive capability of transistors with a greater aspect ratio is better than that with a smaller aspect ratio) to recover upset nodes, whereby hardening single event upset.

Conventional methods for hardening single event upset of a storage unit may increase an area thereof by 140% to 200%, and those for hardening total ionizing dose radiation and single event latchup of the storage unit may increase an area thereof by 200%, which may result in substantial increase in areas of the storage unit and the memory, and make it impossible to facilitate a small-size integrated circuit.

SUMMARY OF THE INVENTION

It is an objective of the invention to provide a radiation-hardened storage unit capable of automatically hardening total ionizing dose radiation and single event latchup, and facilitating single event upset via a redundant and dual-path cyclic feedback method with good irradiation performance, a simple circuit structure, and a small area.

To achieve the above objective, in accordance with one embodiment of the invention, there is provided a radiation-hardened storage unit, comprising a basic storage unit, a redundant storage unit, and a two-way feedback unit. The basic storage unit comprises a first PMOS transistor, a second PMOS transistor, a third PMOS transistor, and a fourth PMOS transistor. The first PMOS transistor and the second PMOS transistor are read-out access transistors. A source of the first PMOS transistor is connected to a read selecting word line, a gate thereof is connected to a storage node, and a drain thereof is connected to a first read-out bit line. A source of the second PMOS transistor is connected to the read selecting word line, a gate thereof is connected to an inverting storage node, and a drain thereof is connected to a second read-out bit line. The third PMOS transistor and the fourth PMOS transistor are write-in access transistors, a source of the third PMOS transistor is connected to the storage node, a gate thereof is connected to a write selecting word line, and a drain thereof is connected to a first write-in bit line. A source of the fourth PMOS transistor is connected to the inverting storage node, a gate thereof is connected to the write selecting word line, and a drain thereof is connected to a second write-in bit line. The redundant storage unit comprises a fifth PMOS transistor, a sixth PMOS transistor, a seventh PMOS transistor, and an eighth PMOS transistor; the fifth PMOS transistor and the sixth PMOS transistor are read-out access transistors, a source of the fifth PMOS transistor is connected to the read selecting word line, a gate thereof is connected to a redundant storage node, and a drain thereof is connected to the first read-out bit line; a source of the sixth PMOS transistor is connected to the read selecting word line, a gate thereof is connected to an inverting redundant storage node, and a drain thereof is connected to a second read-out bit line; the seventh PMOS transistor and the eighth PMOS transistor are write-in access transistors, a source of the seventh PMOS transistor is connected to the redundant storage node, a gate thereof is connected to the write selecting word line, and a drain thereof is connected to the first write-in bit line; a source of the eighth PMOS transistor is connected to the inverting redundant storage node, a gate thereof is connected to the write selecting word line, and a drain thereof is connected to the second write-in bit line. The two-way feedback unit is configured to form a feedback path between the storage node and the redundant storage node, and further to form a feedback path between the inverting storage node and the inverting redundant storage node.

In a class of this embodiment, the two-way feedback unit comprises a ninth PMOS transistor, a tenth PMOS transistor, an eleventh PMOS transistor, and a twelfth PMOS transistor;

a source of the ninth PMOS transistor is connected to the storage node, a gate thereof is connected to the redundant storage node, and a drain thereof is connected to low level GND; a source of the tenth PMOS transistor is connected to the redundant storage node, a gate thereof is connected to the storage node, and a drain thereof is connected to the low level GND; a source of the eleventh PMOS transistor is connected to the inverting storage node, a gate thereof is connected to inverting redundant storage node, and a drain is connected to the low level GND; a source of the twelfth PMOS transistor is connected to the inverting redundant storage node, a gate thereof is connected to the inverting storage node, and a drain thereof is connected to the low level GND.

Advantages of the invention over the prior art comprise:

Since the storage unit is completely formed by PMOS transistors, majority carriers on substrates thereof are electrons, a leakage current channel is not to be formed between a drain and a source of each of the PMOS transistor due to the total ionizing dose radiation, and no leakage current is to be generated, it is not required to harden the total ionizing dose radiation of the PMOS transistor, namely the invention can automatically hardens the total ionizing dose radiation.

Since the storage unit is completely formed by PMOS transistors, there is no feedback ring parasitized therein, and single event latchup can be resisted without a protection ring, namely the invention can automatically hardens the single event latchup.

The invention is capable of automatically hardening total ionizing dose radiation and single event latchup, and facilitating single event upset via a redundant and dual-path cyclic feedback method with good anti-radiation performance, a simple circuit structure, and a small area.

DETAILED DESCRIPTION OF THE EMBODIMENTS

To further illustrate the invention, experiments detailing a radiation-hardened storage unit are described below. It should be noted that the following examples are intended to describe and not to limit the invention.

Figure 1:
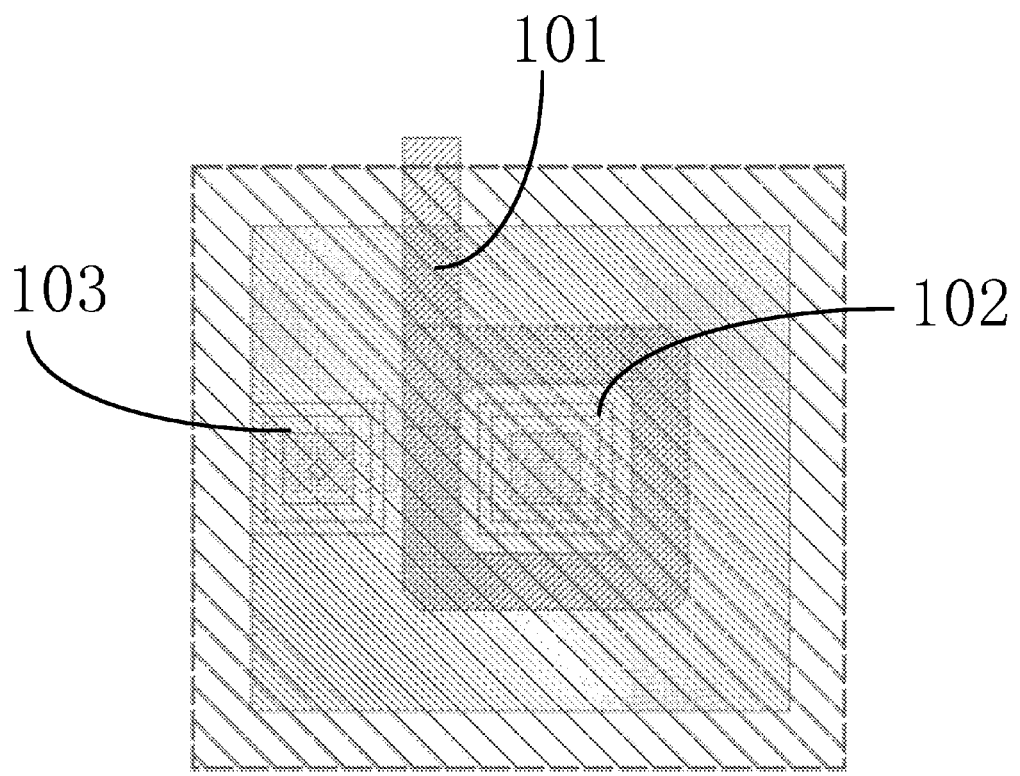
FIG. 1 illustrates hardening a NMOS transistor using an annular FET in the prior art.
Figure 2:
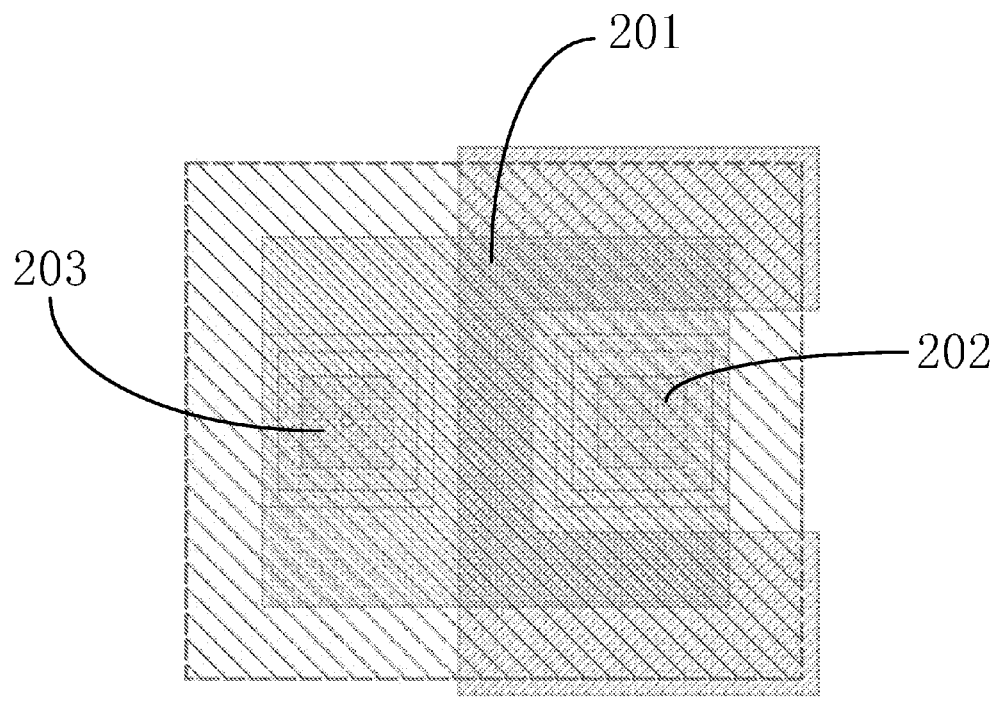
FIG. 2 illustrates hardening a NMOS transistor using a horseshoe FET in the prior art.
Figure 3:
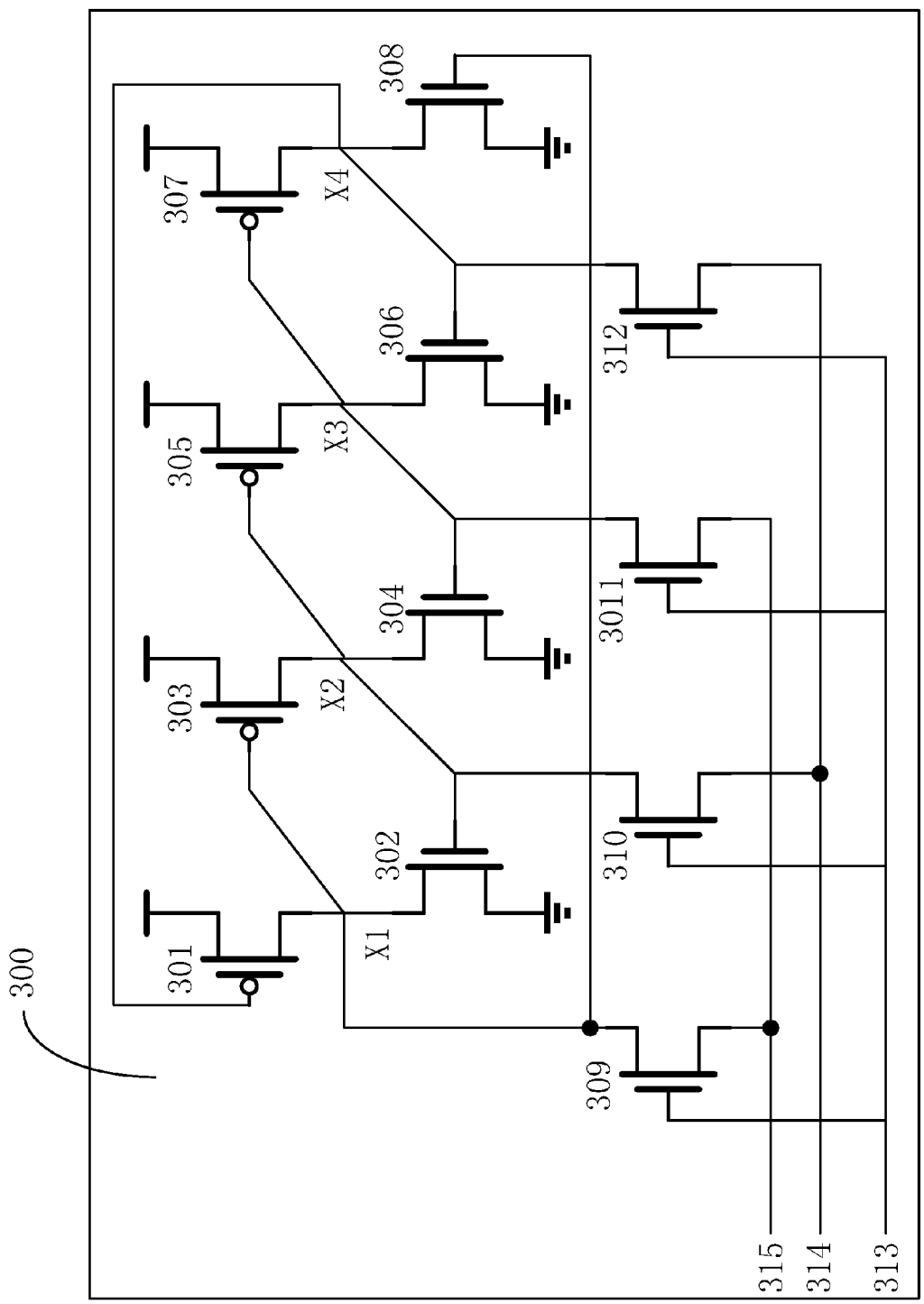
FIG. 3 is a schematic diagram of a DICE unit.
Figure 4:
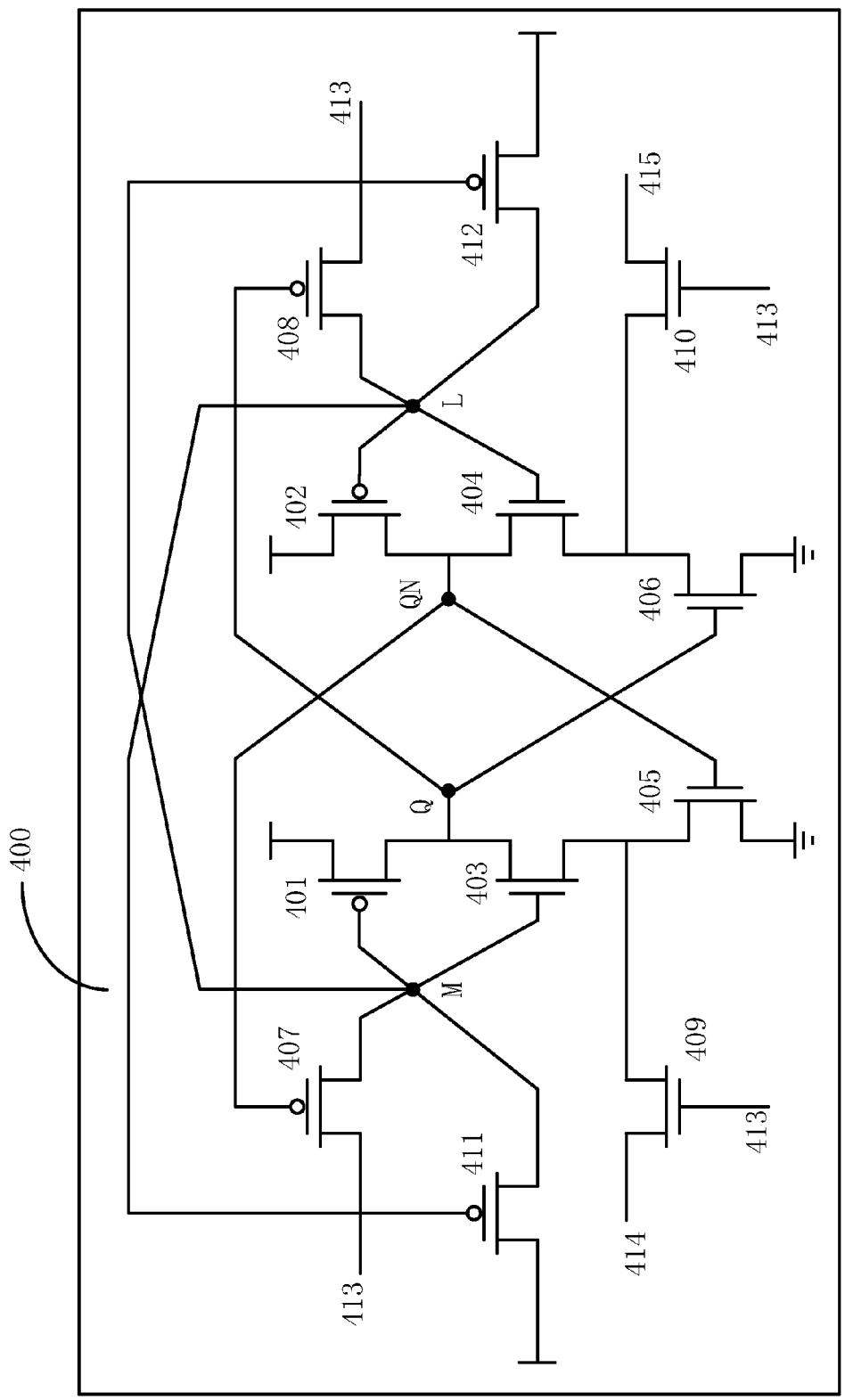
FIG. 4 is a schematic diagram of a HIT unit.
Figure 5:
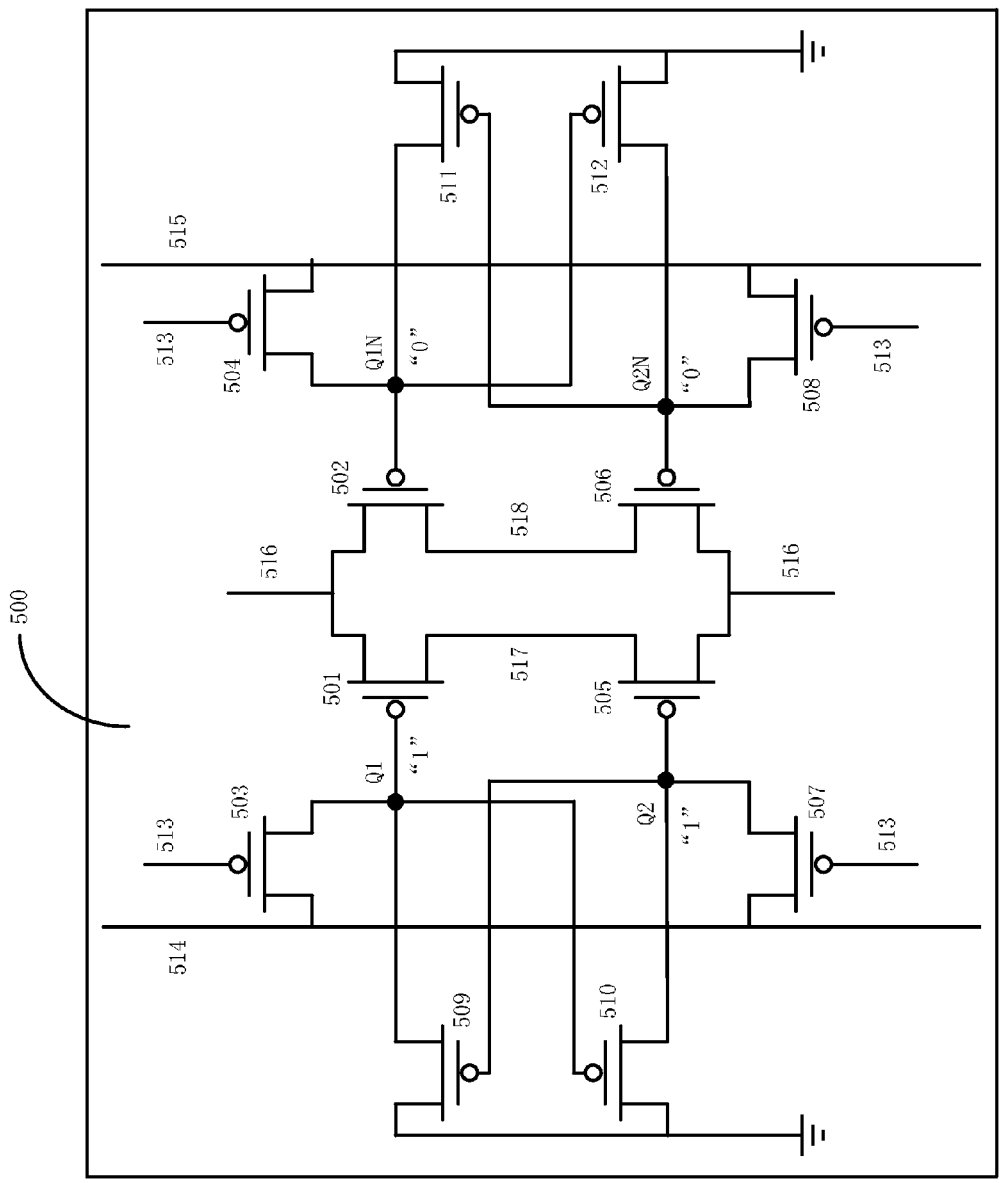
FIG. 5 is a schematic diagram of a radiation-hardened storage unit of an exemplary embodiment of the invention.

As shown in FIG. 5, a storage unit 500 of the invention comprises 12 PMOS transistors 501-512, and substrates of all the PMOS transistors are connected to a power voltage VDD. The storage unit 500 comprises a basic storage unit, a redundant storage unit, and a two-way feedback unit.

The basic storage unit comprises a first PMOS transistor 501, a second PMOS transistor 502, a third PMOS transistor 503, and a fourth PMOS transistor 504. The first PMOS transistor 501 and the second PMOS transistor 502 are read-out access transistors, a source of the first PMOS transistor 501 is connected to a read selecting word line 516, a gate thereof is connected to a storage node Q1, and a drain thereof is connected to a first read-out bit line 517. A source of the second PMOS transistor 502 is connected to the read selecting word line 516, a gate thereof is connected to an inverting storage node Q1N, and a drain thereof is connected to a second read-out bit line 518. The third PMOS transistor 503 and the fourth PMOS transistor 504 are write-in access transistors, a source of the third PMOS transistor 503 is connected to the storage node Q1, a gate thereof is connected to a write selecting word line 513, and a drain thereof is connected to a first write-in bit line 514. A source of the fourth PMOS transistor 504 is connected to the inverting storage node Q1N, a gate thereof is connected to the write selecting word line 513, and a drain thereof is connected to a second write-in bit line 515.

The redundant storage unit comprises a fifth PMOS transistor 505, a sixth PMOS transistor 506, a seventh PMOS transistor 507, and an eighth PMOS transistor 508. The fifth PMOS transistor 505 and the sixth PMOS transistor 506 are read-out access transistors, a source of the fifth PMOS transistor 505 is connected to the read selecting word line 516, a gate thereof is connected to a redundant storage node Q2, and a drain thereof is connected to the first read-out bit line 517. A source of the sixth PMOS transistor 506 is connected to the read selecting word line 516, a gate thereof is connected to an inverting redundant storage node Q2N, and a drain thereof is connected to a second read-out bit line 518. The seventh PMOS transistor 507 and the eighth PMOS transistor 508 are write-in access transistors, a source of the seventh PMOS transistor 507 is connected to the redundant storage node Q2, a gate thereof is connected to the write selecting word line 513, and a drain thereof is connected to the first write-in bit line 514. A source of the eighth PMOS transistor 508 is connected to the inverting redundant storage node Q2N, a gate thereof is connected to the write selecting word line 513, and a drain thereof is connected to the second write-in bit line 515.

The ninth PMOS transistor 509, the tenth PMOS transistor 510, the eleventh PMOS transistor 511, and the twelfth PMOS transistor 512 form a two-way feedback unit between two groups of storage nodes of the basic storage unit and the redundant storage unit. A source of the ninth PMOS transistor 509 is connected to the storage node Q1, a gate thereof is connected to the redundant storage node Q2, and a drain thereof is connected to low level GND. A source of the tenth PMOS transistor 510 is connected to the redundant storage node Q2, a gate thereof is connected to the storage node Q1, and a drain thereof is connected to the low level GND. A source of the eleventh PMOS transistor 511 is connected to the inverting storage node Q1N, a gate thereof is connected to the inverting redundant storage node Q2N, and a drain is connected to the low level GND. A source of the twelfth PMOS transistor 512 is connected to the inverting redundant storage node Q2N, a gate thereof is connected to the inverting storage node Q1N, and a drain thereof is connected to the low level GND.

During write operation of the storage unit 500, the write selecting word line 513 is set to low level GND so that data of the first write-in bit line 514 are written into the storage node Q1 and the redundant storage node Q2, and data of the second write-in bit line 515 are written into the inverting storage node Q1N and the inverting redundant storage node Q2N. When no write operation is performed, the write selecting word line 513 is set to high level VDD, and both the first write-in bit line 514 and the second write-in bit line 515 are pulled up to high level VDD.

Assume current data stored in the storage unit 500 are '1', namely the storage node Q1 and the redundant storage node Q2 are high level '1', the inverting storage node Q1N and the inverting redundant storage node Q2N are low level '0'.

During read operation of the storage unit 500, the read selecting word line 516 is set to high level VDD. As the inverting storage node Q1N is low level '0', the second PMOS transistor 502 is opened, as the inverting redundant storage node Q2N is low level '0', the sixth PMOS transistor 506 is opened, and the read selecting word line 516 charges the second read-out bit line 518 via the second PMOS transistor 502 and the sixth PMOS transistor 506. Meanwhile, as the storage node Q1 and the redundant storage node Q2 are high level '1', the first PMOS transistor 501 and the fifth PMOS transistor 505 are cut off, and the read selecting word line 516 is unable to charge the first read-out bit line 517. Therefore, a voltage difference is generated between the first read-out bit line 517 and the second read-out bit line 518, and then is sensed by a peripheral control circuit and read out. The read operation of the storage unit 500 is non-destructive, and is not to destroy the data stored in the storage unit 500. Therefore, a write-back operation is unnecessary after the read operation. When the read operation is finished, the read selecting word line 516 is set to low level GND, and both the first read-out bit line 517 and the second read-out bit line 518 are pulled down to low level GND.

During data maintenance of the storage unit 500, the write selecting word line 513 is set to high level VDD, and the first write-in bit line 514 and the second write-in bit line 515 are high level VDD. The source of the third PMOS transistor 503 is connected to the storage node Q1 and is high level '1', the gate thereof is high level VDD, the drain thereof is high level VDD, the third PMOS transistor 503 is cut off, and no sub-threshold current exists. The source of the ninth PMOS transistor 509 is connected to the storage node Q1, and is high level '1', the gate thereof is connected to the redundant storage node Q2, and is high level '1', the drain thereof is connected to low level GND, and therefore a sub-threshold leakage current flowing from the storage node Q1 to GND exists in the ninth PMOS transistor 509, and decreases level of the storage node Q1. As level of the storage node Q1 is decreased, bias of the third PMOS transistor 503 is changed, and a sub-threshold leakage current flowing from the first write-in bit line 514 to the storage node Q1 is generated, and makes the level of the storage node Q1 and the sub-threshold current of the ninth PMOS transistor 509 decrease gradually, and the sub-threshold current of the third PMOS transistor 503 increase gradually until the sub-threshold current of the third PMOS transistor 503 is equal to that of the ninth PMOS transistor 509, at that time the level of the storage node Q1 is constant. Variation of the redundant storage node Q2 is the same as that of the storage node Q1, and will not be described hereinafter any longer.

The source of the fourth PMOS transistor 504 is connected to the inverting storage node Q1N and is low level '0', the gate thereof is high level VDD, the drain thereof is high level VDD, the fourth PMOS transistor 504 is cut off, and a sub-threshold current flowing from the second write-in bit line 515 to the inverting storage node Q1N exists. The source of the eleventh PMOS transistor 511 is connected to the inverting storage node Q1N and is low level '0', the gate thereof is connected to the inverting redundant storage node Q2N and is low level '0', the drain thereof is low level GND, and a sub-threshold current flowing from the inverting storage node Q1N to low level GND exists. Initially, the current flowing from the fourth PMOS transistor 504 to the inverting storage node Q1N is greater than that flowing from the inverting storage node Q1N to the eleventh PMOS transistor 511 inverting, and increases voltage of the inverting storage node Q1N. At the same time, the sub-threshold current of the fourth PMOS transistor 504 is decreased, the sub-threshold current of the eleventh PMOS transistor 511 is increased, until the sub-threshold current flowing from the fourth PMOS transistor 504 to the inverting storage node Q1N is equal to that flowing from the inverting storage node Q1N to the eleventh PMOS transistor 511 inverting, at the time level of the inverting storage node Q1N is constant. Variation of the inverting redundant storage node Q2N is the same as that of the inverting storage node Q1N, and will not be described hereinafter any longer.

Due to symmetry of structure of circuit and size of the transistor, if no refreshing is performed, level of the storage node Q1, the inverting storage node Q1N, the redundant storage node Q2, and the inverting redundant storage node Q2N is to be attenuated to the same intermediate value, and the data in the storage unit is invalid. Therefore, to prevent the data in the storage unit from being invalid, cyclic refreshing is required.

As the storage unit 500 is in a data retension state, sensitive nodes therein are nodes storing low level since transistors forming the storage unit 500 are all PMOS transistors and substrates thereof are high level VDD. As the data are '1', the inverting storage node Q1N and the inverting redundant storage node Q2N are sensitive nodes. As the single event upset occurs, one sensitive node in the storage unit 500 (for example, the inverting storage node Q1N) is upset to high level VDD. Since variation in level of the inverting storage node Q1N is not to affect the inverting redundant storage node Q2N, the level of the inverting redundant storage node Q2N is still low level. Based on the above-mentioned content, during the read operation, the inverting redundant storage node Q2N opens the sixth PMOS transistor 506, and a voltage difference is generated between the first read-out bit line 517 and the second read-out bit line 518, and correct data can still be read out. Meanwhile, since the inverting redundant storage node Q2N is low level, and the inverting storage node Q1N is high level VDD, the eleventh PMOS transistor 511 is on and generates a discharge current, which pulls down voltage of the inverting storage node Q1N, and recovers level of the upset inverting storage node Q1N, and thus hardening the single event upset. As an upset sensitive node is the inverting redundant storage node Q2, the twelfth PMOS transistor 512 is on and generates a discharge current, which pulls down voltage of the inverting redundant storage node Q2N, and recovers stored data.

Similarly, as data in the storage unit 500 is '0', the sensitive nodes are the storage node Q1 and the redundant storage node Q2. After the single event upset occurs, the ninth PMOS transistor 509 and the tenth PMOS transistor 510 perform data recovery.

The storage unit of the invention is completely formed by PMOS transistors, and is capable of automatically hardening total ionizing dose radiation and single event latchup, and facilitating single event upset via a redundant and dual-path cyclic feedback method with good anti-radiation performance, a simple circuit structure, and a small area.

While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

The invention claimed is:
1. A radiation-hardened storage unit, comprising
a) a basic storage unit;
b) a redundant storage unit; and
c) a two-way feedback unit;
wherein said basic storage unit comprises a first PMOS transistor (501), a second PMOS transistor (502), a third PMOS transistor (503), and a fourth PMOS transistor (504); said first PMOS transistor (501) and said second PMOS transistor (502) are read-out access transistors; a source of said first PMOS transistor (501) is connected to a read selecting word line (516), a gate thereof is connected to a storage node (Q1), and a drain thereof is connected to a first read-out bit line (517); a source of said second PMOS transistor (502) is connected to said read selecting word line (516), a gate thereof is connected to an inverting storage node (Q1N), and a drain thereof is connected to a second read-out bit line (518); said third PMOS transistor (503) and said fourth PMOS transistor (504) are write-in access transistors; a source of said third PMOS transistor (503) is connected to said storage node (Q1), a gate thereof is connected to a write selecting word line (513), and a drain thereof is connected to a first write-in bit line (514); a source of said fourth PMOS transistor (504) is connected to said inverting storage node (Q1N), a gate thereof is connected to said write selecting word line (513), and a drain thereof is connected to a second write-in bit line (515);

said redundant storage unit comprises a fifth PMOS transistor (505), a sixth PMOS transistor (506), a seventh PMOS transistor (507), and an eighth PMOS transistor (508); said fifth PMOS transistor (505) and said sixth PMOS transistor (506) are read-out access transistors; a source of said fifth PMOS transistor (505) is connected to said read selecting word line (516), a gate thereof is connected to a redundant storage node (Q2), and a drain thereof is connected to said first read-out bit line (517); a source of said sixth PMOS transistor (506) is connected to said read selecting word line (516), a gate thereof is connected to an inverting redundant storage node (Q2N), and a drain thereof is connected to a second read-out bit line (518); said seventh PMOS transistor (507) and said eighth PMOS transistor (508) are write-in access transistors; a source of said seventh PMOS transistor (507) is connected to said redundant storage node (Q2), a gate thereof is connected to said write selecting word line (513), and a drain thereof is connected to said first write-in bit line (514); a source of said eighth PMOS transistor (508) is connected to said inverting redundant storage node (Q2N), a gate thereof is connected to said write selecting word line (513), and a drain thereof is connected to said second write-in bit line (515); and said two-way feedback unit is configured to form a feedback path between said storage node (Q1) and said redundant storage node (Q2), and further to form a feedback path between said inverting storage node (Q1N) and said inverting redundant storage node (Q2N).

2. The radiation-hardened storage unit of claim 1, wherein said two-way feedback unit comprises a ninth PMOS transistor (509), a tenth PMOS transistor (510), an eleventh PMOS transistor (511), and a twelfth PMOS transistor (512);

a source of said ninth PMOS transistor (509) is connected to said storage node (Q1), a gate thereof is connected to said redundant storage node (Q2), and a drain thereof is connected to low level GND;

a source of said tenth PMOS transistor (510) is connected to said redundant storage node (Q2), a gate thereof is connected to said storage node (Q1), and a drain thereof is connected to said low level GND;

a source of said eleventh PMOS transistor (511) is connected to said inverting storage node (Q1N), a gate thereof is connected to inverting redundant storage node (Q2N), and a drain is connected to said low level GND; and a source of said twelfth PMOS transistor (512) is connected to said inverting redundant storage node (Q2N), a gate thereof is connected to said inverting storage node (Q1N), and a drain thereof is connected to said low level GND.

* * * * *